US009928906B2

(12) United States Patent
Hanyu et al.

(10) Patent No.: US 9,928,906 B2
(45) Date of Patent: Mar. 27, 2018

(54) DATA-WRITE DEVICE FOR RESISTANCE-CHANGE MEMORY ELEMENT

(71) Applicant: TOHOKU UNIVERSITY, Sendai-shi (JP)

(72) Inventors: Takahiro Hanyu, Sendai (JP); Daisuke Suzuki, Sendai (JP); Masanori Natsui, Sendai (JP); Akira Mochizuki, Sendai (JP); Hideo Ohno, Sendai (JP); Tetsuo Endoh, Sendai (JP)

(73) Assignee: Tohoku University, Sendai-shi, Miyagi (JP)

( * ) Notice: Subject to any disclaimer, the term of this patent is extended or adjusted under 35 U.S.C. 154(b) by 35 days.

(21) Appl. No.: 15/128,020

(22) PCT Filed: Mar. 24, 2015

(86) PCT No.: PCT/JP2015/058988
§ 371 (c)(1),
(2) Date: Jun. 26, 2017

(87) PCT Pub. No.: WO2015/147016
PCT Pub. Date: Oct. 1, 2015

(65) Prior Publication Data
US 2017/0365338 A1    Dec. 21, 2017

(30) Foreign Application Priority Data

Mar. 24, 2014  (JP) .................................. 2014-060901

(51) Int. Cl.
*G11C 13/00* (2006.01)
*G11C 11/16* (2006.01)
(52) U.S. Cl.
CPC ...... *G11C 13/0064* (2013.01); *G11C 11/1677* (2013.01); *G11C 13/0069* (2013.01);
(Continued)

(58) Field of Classification Search
CPC ............ G11C 13/0011; G11C 13/0069; G11C 13/0004; G11C 13/0007
(Continued)

(56) References Cited

U.S. PATENT DOCUMENTS

2009/0262568 A1* 10/2009 Ono ..................... G11C 13/0011
365/148
2009/0323396 A1  12/2009 Inaba

FOREIGN PATENT DOCUMENTS

JP     2010-231686     10/2010
JP     2011-151515     8/2011
(Continued)

OTHER PUBLICATIONS

Int'l. Search Report issued in Int'l. App. No. PCT/JP2015/058988, dated Apr. 28, 2015.
(Continued)

*Primary Examiner* — Jason Lappas
(74) *Attorney, Agent, or Firm* — Greer Burns & Crain Ltd.

(57) ABSTRACT

A data-write device includes a write driver that causes a current to flow through a current path including an MTJ element or the other current path including the MTJ element in accordance with writing data to be written, thereby writing the write data into the MTJ element, a write completion detector which monitors the voltage at a first connection node or a second connection node in accordance with the write data after the writing of the write data into the MTJ element starts, detects the completion of writing of the write data based on the voltage at either node, and supplies a write completion signal indicating the completion of data write, and a write controller that terminates the writing of the write data into the MTJ element in response to the write completion signal supplied from the write completion detector.

7 Claims, 14 Drawing Sheets

(52) U.S. Cl.
CPC ...... *G11C 11/1657* (2013.01); *G11C 13/0004* (2013.01); *G11C 13/0007* (2013.01); *G11C 2013/0066* (2013.01); *G11C 2013/0078* (2013.01); *G11C 2013/0083* (2013.01)

(58) Field of Classification Search
USPC .......................................................... 365/148
See application file for complete search history.

(56) References Cited

FOREIGN PATENT DOCUMENTS

WO    WO 2007/015358 A1    2/2007
WO    WO 2008/012871 A1    1/2008

OTHER PUBLICATIONS

P. Zhou et al.; Energy Reduction for STT-Ram Using Early Write Termination; ICCAD, p. 264, Nov. 2009.
Y. Lakys, et al.; "Self-Enabled "Error-Free" Switching Circuit for Spin Transfer Torque MRAM and Logic"; IEEE Trans. Magn. vol. 48, No. 9, p. 2403, Nov. 2012.
N. Strikos, et al.; "Low-Current Probabilistic Writes for Power-efficient STT-Ram Caches"; Proc. ICCD, p. 511, Oct. 2013.
T. Zheng, et al.; "Variable-Energy Write STT-Ram Architecture with Bit-Wise Write-Completion Monitoring"; Proc. ISLPED, p. 229, Sep. 2013.

* cited by examiner (DATA "0" WRITTEN)

(DATA "0" WRITTEN)

(DATA "1" WRITTEN)

(DATA "1" WRITTEN)

DATA-WRITE DEVICE FOR RESISTANCE-CHANGE MEMORY ELEMENT

TECHNICAL FIELD

The present disclosure relates to a data-write device for a resistance-change memory element.

BACKGROUND ART

A Resistance-change memory elements, such as a Magnetic Tunneling Junction (MTJ) element, change the resistance state thereof when a write current is supplied thereto. However, the timing at which the resistance state changes varies element by element. Hence, for supplying a write current to resistance-change memory elements, a sufficient time that allows the memory element to change the resistance state is ensured. According to this scheme, however, the write current is still supplied to the memory elements even after the resistance state of the resistance-change memory elements have changed (even after data write has completed), and thus a wasteful power consumption is made.

Non Patent Literatures 1 to 4 disclose technologies of detecting a completion of data write in resistance-change memory elements. Non Patent Literatures 1 to 3 disclose devices which intermittently read data stored in memory elements, and which detect the completion of write upon reading of the data to be written. Non Patent Literature 4 discloses a device that detects the completion of data write when the voltage at one end of a resistance-change memory element changes to a voltage corresponding to the data to be written.

CITATION LIST

Non Patent Literature

Non Patent Literature 1: P. Thou, et al., "Energy Reduction for STT-RAM using Early Write Termination", ICCAD, p. 264, November 2009

Non Patent Literature 2: Y. Lakys, et al., "Self-Enabled "Error-Free" Switching Circuit for Spin Transfer Torque MRAM and Logic", IEEE Trans. Magn. Vol. 48, No. 9, p. 2403, November 2012

Non Patent Literature 3: N. Strikos, et al., "Low-Current Probabilistic Writes for Power-Efficient STT-RAM Caches", Proc. ICCD, p. 511, October 2013

Non Patent Literature 4: T. Zheng, et al., "Variable-Energy Write STT-RAM Architecture with Bit-Wise Write-Completion Monitoring", Proc. ISLPED, p. 229, September 2013

SUMMARY OF INVENTION

Technical Problem

The devices disclosed in Non Patent Literatures 1 to 3 have a time difference until the completion of the data write is detected after the data write has actually completed when the cycle of reading data from the memory element is long. Hence, a wasteful power consumption by the time difference is made. Conversely, when the cycle of reading data from the memory element is short, the number of times of reading data therefrom increases, resulting in an increase in power consumption.

In addition, according to the device disclosed in Non Patent Literature 4, in accordance with the direction in which a write current flows in the memory element, the voltage change to be detected becomes large or small. When the detected voltage change is small, there is a possibility that a detection of the completion of data write is improper. Hence, the device disclosed in Non Patent Literature 4 has a disadvantage that the detection margin for the write completion is low. Still further, the device disclosed in Non Patent Literature 4 needs a circuit to detect a change in voltage at one end of the memory element for each data to be written. This circuit includes, for example, a flip-flop with a re-setting function, and thus there is a disadvantage such that the circuit area is large.

The present disclosure has been made in view of the foregoing circumstances, and an objective is to provide a data-write device which has a high detection margin for a write completion, and which is capable of reducing a power consumption at the time of data write by a simple circuit structure.

Solution to Problem

In order to accomplish the above objective, a data-write device for a resistance-change memory element according to the present disclosure, wherein a first PMOS transistor that has a drain node connected to a drain node of a first NMOS transistor, an end of a resistance-change memory element being connected to a first connection node that connects the drain node of the first PMOS transistor to the drain node of the first NMOS transistor;

a second NMOS transistor that has a drain node connected to a drain node of a second PMOS transistor, an other end of the resistance-change memory element being connected to a second connection node that connects the drain node of the second PMOS transistor to the drain node of the second PMOS transistor;

the data-write device comprising:

write means that causes a current to flow through a current path comprising the first PMOS transistor, the memory element, and the second NMOS transistor, or a current path comprising the second PMOS transistor, the memory element, and the first NMOS transistor in accordance with data to be written, thereby writing the data in the memory element;

write completion detecting means that monitors a voltage at the first connection node or the second connection node in accordance with the data to be written after data writing in the memory element starts, detects a completion of the writing of the data based on the voltage at the either connection node, and supplies a write completion signal indicating the completion of writing of the data; and write control means that causes the write means to terminate the writing of the data in the memory element in response to the write completion signal supplied from the write completion detecting means.

For example, when the voltage at the either one end of the memory element exceeds a pre-set threshold or becomes lower than the threshold, the write completion detecting means supplies the write completion signal.

For example, the write completion detecting means includes an inverter, and when the voltage at the either one end of the memory element exceeds a threshold set for the inverter or becomes lower than the threshold, the inverter outputs the write completion signal.

For example, the write completion detecting means outputs the write completion signal when the write means writes first data in the memory element, the memory element changes from a low-resistance state to a high-resistance state, and a voltage at a first end of the memory element becomes a larger value than a first threshold from a smaller value than the first threshold, and the write means writes second data in the memory element, the memory element changes from the high-resistance state to the low-resistance state, and a voltage at a second end of the memory element becomes a smaller value than a second threshold from a larger value than the second threshold.

For example, the write completion detecting means includes means that selects either a voltage at a first end of the write means or a voltage at a second end thereof in accordance with the data to be written.

For example, the write control means includes a write request acceptor at accepts a request for write first data or second data, a first write controller that causes the write means to write the first data in the memory element in accordance with the request for write the first data accepted by the write request acceptor, and a second write controller that causes the write means to write the second data in the memory element in accordance with the request for write the second data accepted by the write request acceptor, the first write controller causes the write means to terminate the writing of the first data in the memory element in response to the write completion signal corresponding to the first data and supplied from the write completion detecting, means, and the second write controller causes the write means to terminate the writing of the second data in the memory element in response to the write completion signal corresponding to the second data and supplied from the write completion detecting means.

For example, a plurality of the memory elements is laid out, an end of each of the memory elements is connected to a pair of bit lines via a transistor for selection, the write means writes the data to be written in the selected memory element via the pair of bit lines, and the write completion detecting means detects the completion of the data write based on a voltage at the either bit line to which the one end of the selected memory element is connected.

Advantageous Effects of Invention

According to the present disclosure a high detection margin for the write completion is ensured, while at the same time, a power consumption at the time of data write is reduced by a simple structure.

DESCRIPTION OF EMBODIMENTS

A data-write device according to an embodiment of the present disclosure will be explained below with reference to the figures.

Figure 1:
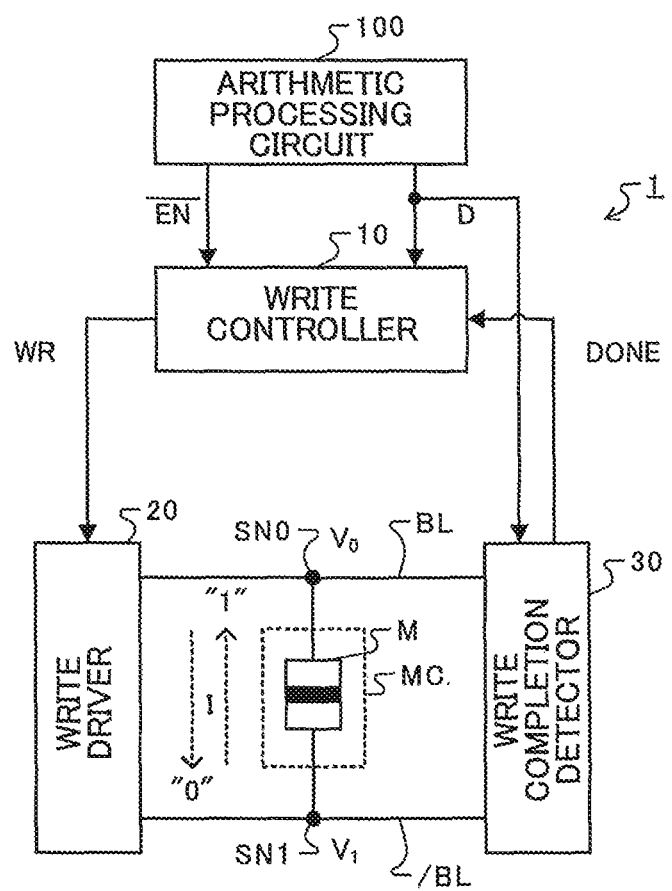
FIG. 1 is a block diagram illustrating a data-write device according to an embodiment of the present disclosure.

As illustrated in FIG. 1, a data-write device 1 writes data in a memory cell MC. The memory cell MC includes a single Magnetic Tunneling Junction (MTJ) element M. The data-write device 1 writes data by causing a current corresponding to data to be written that is "0" or "1" to flow through the MTJ element M, The data-write device 1 detects the completion of data write when the resistance state of the MTJ element M changes, and stops current-carrying though the MTJ element M. Hereinafter, data to be written will be referred to as write data D, and a current to write data into the MTJ element M will be referred to as a write current I.

The data-write device 1 includes a write controller 10, a write driver 20, and a write completion detector 30.

The write controller 10 receives, from an arithmetic processing circuit 100 that is, for example, a Central Processing Unit (CPU), a signal indicating the write data D and an enable bar signal /EN. In addition, the write controller 10 receives a write completion signal DONE from the write completion detector 30. The write controller 10 supplies, to the write driver 20 in accordance with the signal level of the received enable bar signal /EN from the arithmetic processing circuit 100 and the signal level of the received write completion signal DONE from the write completion detector 30, a valid write drive signal WR (write drive signal WR in active level) or an invalid write drive signal WR (write drive signal WR in inactive level), More specifically, after receiving the enable bar signal /EN in a low level, and until receiving the write completion signal DONE in a high level, the write controller 10 keeps supplying the write drive signal WR in the active level to the write driver 20. In addition, the write controller 10 keeps supplying the write drive signal WR in the inactive level to the write driver 20 while receiving the enable bar signal /EN in the high level and the write completion signal DONE in the high level.

The write driver 20 is connected to the bit line BL, and the bit line bar /BL. The write driver 20 causes a write current I in a direction in accordance with the write data D to flow through the bit line BL and the bit line bar /BL upon receiving the write drive signal WR in the active level from the write controller 10. Hence, the write current I flows through a current path formed by the bit line BL, the MTJ element M, and the bit line bar /BL, and thus data D that is "0" or "1" is written into the MTJ element M.

Figure 2:
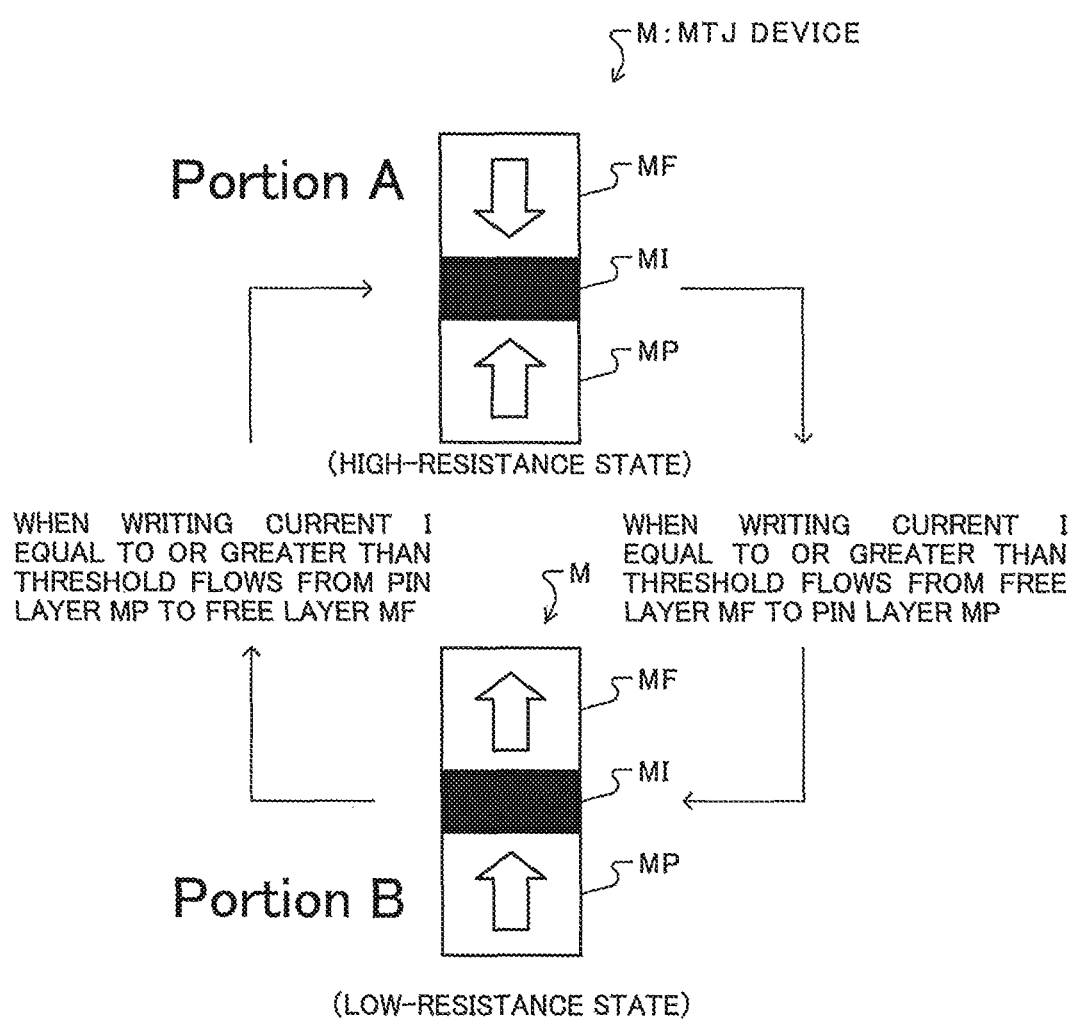
FIG. 2 is a diagram in which portion A illustrates a structure of an MTJ element in a high-resistance state, whereas portion B illustrates a structure of the MTJ element in a low-resistance state.

As illustrated in FIG. 2, the MTJ element M includes three layers that is a pin (fixed) layer MP, an insulation layer MI, and a free (movable) layer MF.

The pin layer MP and the free layer MF are each formed of a material, such as a ferromagnetic material (for example, CoFeB), a ferromagnetic Heusler alloy (for example, Co2FeAl, Co2MnSi). The magnetization direction of the pin layer MP is fixed, and does not change even if the current flows in this layer. Conversely, the magnetization direction of the free layer MF is variable, and changes when the current flows in this layer.

The insulation layer MI is a thin film provided between the pin, layer MP and the free layer MF. The insulation layer MI is formed of a material, such as magnesium oxide (MgO), alumina (Al2O3), or spinel single crystal (MgAl2O4).

When the magnetization direction of the free layer MF changes relative to the magnetization direction of the pin layer MP, the resistance value of the MTJ element M changes. Portion B of FIG. 2 illustrates a state (parallel state) in which the magnetization direction of the pin layer MP and that of the free layer MF are aligned with each other. Portion A of FIG. 2 illustrates a state (antiparallel state) in which the magnetization direction of the pin layer MP and that of the free layer MF are not aligned. The resistance value of the MTJ element is smaller when in the parallel state than when in the antiparallel state. The resistance state of the MTJ element in the parallel state will be referred to as a low-resistance state, while the resistance state of the MTJ element in the antiparallel state will be referred to as a high-resistance state.

In order to switch the resistance state of the MTJ element, the write current I at a necessary current value (current threshold) for a magnetization reversal is caused to flow through the MTJ element M. With the MTJ element M being in the high-resistance state, when the write current I that is equal to or greater than the current threshold flows from the free layer MF to the pin layer MP, the magnetization of the free layer MF is reversed, and thus the state changes to a state in which the magnetization direction of the free layer MF and that of the pin layer MP are aligned. That is, the MTJ element M switches to the low-resistance state.

Conversely, when the MTJ element M is in the low-resistance state, and when the write current I equal to or greater than the current threshold flows from the pin layer MP to the free layer MF, the magnetization direction of the free layer MF is reversed, and thus the state changes to a state in which the magnetization direction of the free layer MF and that of the pin layer MP are opposite to each other. That is, the resistance state of the MTJ element M switches to the high-resistance state.

In the following explanation, the low-resistance state of the MTJ element M is associated with data "0", while the high-resistance state is associated with data "1". That is, the memory cell MC stores 1-bit data. When the MTJ element M changes from the high-resistance state to the low-resistance state, the data "0" is written in the memory cell MC. When the MTJ element M changes from the low-resistance state to the high-resistance state, the data "1" is written in the memory cell MC.

With reference to FIG. 1, the write completion detector 30 is connected to a pair of bit line and bit line bar /BL. The MTJ element M has one end connected to the bit line BL at a node SN0. The MTJ element M has the other end connected to the bit line bar /BL at a node SN1. The write completion detector 30 continuously monitors the voltage of the connection node selected from the nodes SN0, SN1 in accordance with the write data. When the voltage of the selected node from the nodes SN0, SN1 satisfies a threshold condition, the write completion detector 30 detects the completion of data write. More specifically, when the voltage of the node SN0, SN1 changes from a condition lower than the threshold to a condition exceeding the threshold, or from the condition exceeding the threshold to the condition lower than the threshold, the write completion detector 30 detects the completion of data write. The respective thresholds of the nodes SN0, SN1 will be referred to as $V_{th0}$, $V_{th1}$. A voltage $V_0$ of the connection node SN0, and a voltage $V_1$ of the connection node SN1 represent the voltages at respective ends of the MTJ element M. When the voltage $V_0$ of the node SN0 becomes lower than the threshold $V_{th0}$, the write completion detector 30 detects the completion of writing of the write data D that is "0". In addition, when the voltage $V_1$ of the node SN1 exceeds the threshold $V_{th1}$, the write completion detector 30 detects the completion of writing of the write data D that is "1".

Figure 3:
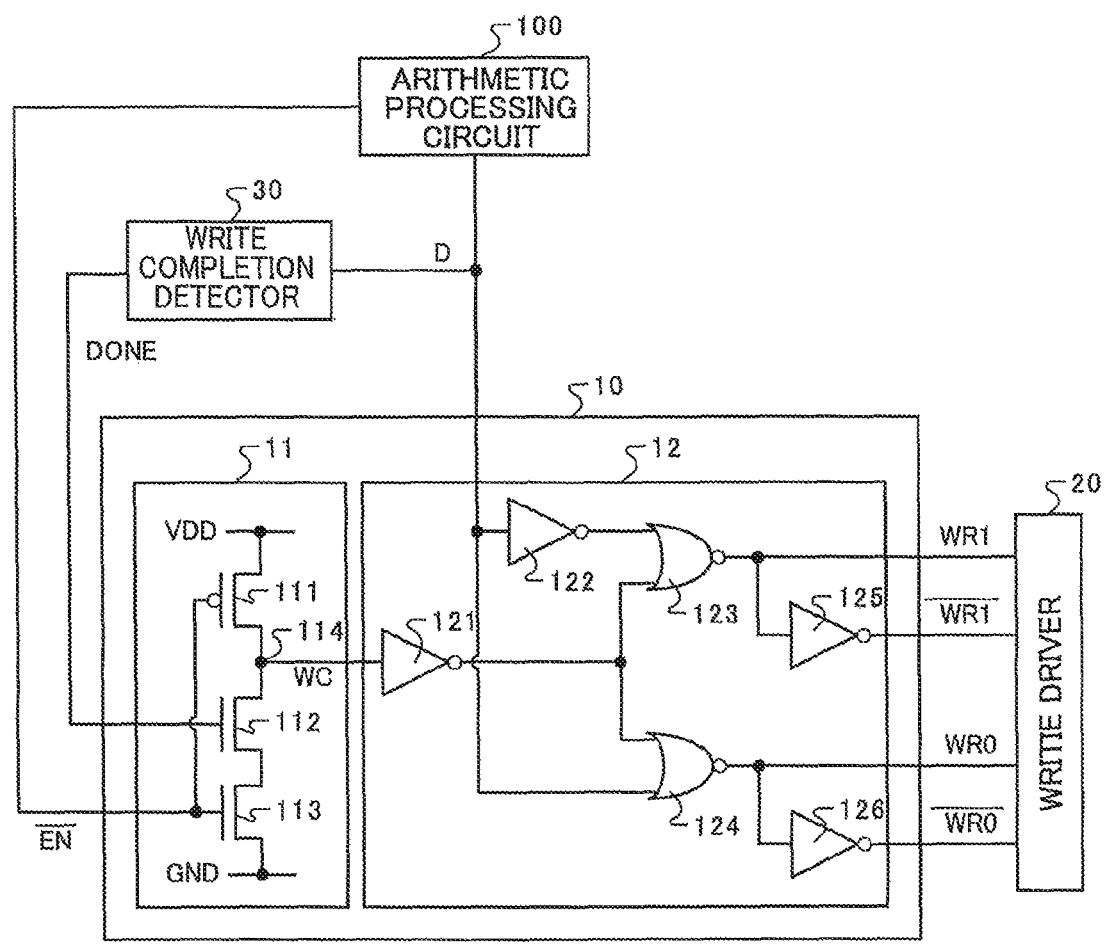
FIG. 3 is a diagram illustrating a circuit structure of a write controller illustrated in FIG. 1.

Upon detecting of the completion of writing of the write data D, the write completion detector 30 supplies the write completion signal DONE in the high level indicating the completion of writing to the write controller 10. When detecting that the next data writing starts based on the signal indicating the data D supplied from the arithmetic processing circuit 100, the write completion detector 30 terminates the supply of the write completion signal 10 in the high level, Conversely, when the voltage $V_0$ of the node SN0 exceeds the threshold $V_{th0}$, or when the voltage $V_1$ of the node SN1 is lower than the threshold $V_{th1}$, the write completion detector 30 supplies the write completion signal DONE in the low level to the write controller 10, Next, with reference to FIG. 3, a circuit structure of the write controller 10 will be explained.

The write controller 10 includes a control signal supplier 11, and a drive signal supplier 12.

The control signal supplier 11 supplies, to the drive signal supplier 12, a write control signal WC in the high level or in the low level indicating the validity or invalidity of data write in accordance with the supplied enable bar signal /EN from the arithmetic processing circuit 100, and the write completion signal DONE supplied from the write completion detector 30.

The control signal supplier 11 includes a P-channel Metal Oxide Semiconductor Field-Effect Transistor (MOSFET) 111, and an N-channel MOSFETs, 112, 113.

The P-channel MOSFET 111 has a source connected to a power supply via a power supply line VDD, has a drain connected to the drain of the N-channel MOSFET 112, and has a gate connected to the arithmetic processing circuit 100 via a signal line. The enable bar signal /EN is input to the gate from the arithmetic processing circuit 100.

The N-channel MOSFET 112 has the drain connected to the drain of the P-channel MOSFET 111, has a source connected to the drain of the N-channel MOSFET 113, and has a gate connected to the write completion detector 30 via a signal line. The write completion signal DONE is input to the gate from the write completion detector 30.

The N-channel MOSFET 113 has the drain connected to the source of the N-channel MOSFET 112, has a source connected to a ground line GND, and has a gate connected to the arithmetic processing circuit via a signal line. The enable bar signal /EN is input to the gate from the arithmetic processing circuit 100.

A node 114 is a connection between the P-channel MOSFET 111 and the N-channel MOSFET 112. The node 114 is connected to an inverter 121 of the drive signal supplier 12 via a signal line. The write control signal WC in the high level or in the low level in accordance with the potential of the node 114 is supplied to the drive signal supplier 12.

When the arithmetic processing circuit 100 outputs the enable bar signal /EN in the low level, the P-channel MOSFET 111 becomes an ON state, while the N-channel MOSFET 113 becomes an OFF state. The enable bar signal /EN in the low level is a signal to start writing of data into the MTJ element M.

In addition, when the write completion detector 30 outputs the write completion signal DONE in the high level, the N-channel MOSFET 112 becomes the ON state. After detecting the completion of data write, and until detecting a start of data write different from that data, the write completion detector 30 keeps on outputting, the write completion signal DONE in the high level. More specifically, after detecting the completion of writing of the data "0" and until detecting the start of writing of the data "1", and after detecting the completion of writing of the data "1" and until detecting the start of writing of the data "0", the write completion detector 30 keeps on outputting the write completion signal DONE in the high level.

The state in which the P-channel MOSFET 111, and the N-channel MOSFET 112 are in the ON states, and the N-channel MOSFET 113 is in the OFF state will be referred to as an initialization state below. In the initialization state, the power supply voltage applied via the power supply line VDD accumulates charges in the region (node 114) between the P-channel MOSFET 111 and the N-channel MOSFET 113. The accumulated charges at the node 114 supply the write control signal WC in the high level to the drive signal supplier 12.

In addition, when the write completion detector 30 outputs the write completion signal DONE in the low level, the N-channel MOSFET 112 becomes the OFF state. The write completion signal DONE in the low level is continuously supplied from the write completion detector 30 after the writing of the write data D starts and until the resistance state of the MTJ element changes.

When the P-channel MOSFET 111 is in the ON state, and the N-channel MOSFETs 112, 113 are in the OFF state, the power supply voltage applied via the power supply line VDD accumulates charges at the region (node 114) between the P-channel MOSFET 111 and the N-channel MOSFET 112. The accumulated charges at the node 114 supply the write control signal WC in the high level to the drive signal supplier 12.

In addition, when the arithmetic processing circuit 100 outputs the enable bar signal /EN in the high level, the P-channel MOSFET 111 becomes the OFF state, and the N-channel MOSFET 113 becomes the ON state. The write control signal supplier 11 stands by, in this state, until the write completion signal DONE in the high level is supplied from the write completion detector 30, and prepares for terminating the writing into the MTJ element immediately after the write completion signal DONE in the high level is supplied. The arithmetic processing circuit 100 keeps on outputting the enable bar signal /EN in the high level for a predetermined time period (sufficiently shorter time than a time until the resistance state of the MTJ element M changes, for example, several nano seconds) after outputting the enable bar signal /EN in the low level. After the predetermined time period has elapsed, the arithmetic processing circuit 100 terminates the output of the enable bar signal /EN in the low level, and starts outputting the enable bar signal /EN in the high level. In the example case illustrated in FIG. 5D, the enable bar signal /EN in the low level is being output for a time period between a time t1 and a time t1', and a time period between a time t4 and a time t4'.

When the P-channel MOSFET 111 and the N-channel MOSFET 112 are in the OFF states, and the N-channel MOSFET 113 is in the ON state, the accumulated charges at the node 114 supply the write control signal WC in the high level to the drive signal supplier 12.

When the P-channel MOSFET 111 is in the OFF state, and the N-channel MOSFETs 112, 113 are in the ON states, the accumulated charges at the region (node 114) between the P-channel MOSFET 111 and the N-channel MOSFET 112 are discharged to the ground line GND. Hence, the write control signal WC in the low level is supplied to the drive signal supplier 12.

The drive signal supplier 12 outputs, to the write driver 20, the write drive signal WR in accordance with the signal indicating the write data D supplied from the arithmetic processing circuit 100, and the write control signal WC supplied from the control signal supplier 11.

The drive signal supplier 12 keeps on outputting the valid write drive signal WR to the write driver 20 while the write control signal WC in the high level is being supplied. More specifically, the drive signal supplier 12 sets, in accordance with the write data D, either write drive signals WR0 and /WR0, or write drive signals WR1 and /WR1 to be active level and the other signals to be inactive level.

In addition, while the write control signal WC in the low level is being supplied, the drive signal supplier 12 outputs the write drive signal WR in the inactive level to the write driver 20 regardless of whether the write data D is "0" or "1".

The drive signal supplier 12 includes inverters 121, 122, 125, 126, and a NOR gates 123, 124.

When the write data D is "1", and the wiring control signal WC in the high level is being, supplied, the drive signal supplier 12 supplies, to the write driver 20, the write drive signal WR1 in the high level and the write drive signal /WR1 in the low level via the inverters 121, 122, 125 and the NOR gate 123. Note that the write drive signal WR0 is the low level, while the write drive signal /WR0 is the high level When the write data D is "0", and the wiring control signal. WC in the high level is being supplied, the drive signal supplier 12 supplies, to the write driver 20, the write drive signal WR0 in the high level and the write drive signal /WR0 in the low level via the inverters 121, 126 and the NOR gate 124. Note that the write drive signal WR1 is the low level, while the write drive signal /WR1 is the high level.

Next, with reference to FIG. 4, an explanation will be given of a circuit structure of the write driver 20 and that of the write completion detector 30.

The write driver 20 includes a bit line driver 21 and a bit line bar driver 22.

The bit line driver 21 is connected to the bit line BL. The bit line bar driver 22 is connected to the bit line bar /BL, In addition, the bit line driver 21 and the bit line bar driver 22 are connected to the write controller 10 via signal lines. The bit line driver 21 and the bit line bar driver 22 cause the write current I to flow into the MTJ element M based on the signal level of the write drive signal WR supplied from the write controller 10.

The bit line driver 21 includes a P-channel MOSFET 211, and an N-channel MOSFET 212.

The P-channel MOSFET 211 has a source connected to the power supply via the power supply line VDD, has a drain connected to the bit line BL, and has a gate connected to the write controller 10 via a signal line. The write drive signal /WR0 is input to the gate from the write controller 10.

The N-channel MOSFET 212 has a source connected to the ground line GND, has a drain connected to the bit line BL, and has a gate connected to the write controller 10 via a signal line. The write drive signal WR1 is input to the gate from the write controller 10.

The bit line bar driver 22 includes an N-channel MOSFET 221, and a P-channel MOSFET 222.

The N-channel MOSFET 221 has a source connected to the ground GND, has a drain connected to the bit line bar /BL, and has a gate connected to the write controller 10 via a signal line. The write drive signal WR0 is input to the gate from the write controller 10.

The P-channel MOSFET 222 has a source connected to the power supply via the power supply line VDD, has a drain connected to the bit line bar /BL, and has a gate connected to the write controller 10 via a signal line. The write drive signal /WR1 is input to the gate from the write controller 10.

When the write controller 10 outputs the write drive signal /WR0 in the low level, and the write drive signal WR0 in the high level, the P-channel MOSFET 211 and the N-channel MOSFET 221 become the ON states. Hence, the write current (forward direction current) flows from the power supply line VDD through the P-channel MOSFET 211, the bit line BL, the MTJ element M, the bit line bar /BL, the N-channel MOSFET 221, and the ground line GND in this sequence. Accordingly, the write data D that is "0" is written into the MTJ element M.

In addition, when the write controller 10 outputs the write drive signal WR1 in the high level, and the write drive signal /WR1 in the low level, the N-channel MOSFET 212 and the P-channel MOSFET 222 become the ON states. Hence, the write current I (reverse direction current) flows from the power supply line VDD through P-channel MOSFET 222, the bit line bar /BL, the MTJ element M, the bit line BL, the N-channel MOSFET 212, and the ground line GND in this sequence. Accordingly, the write data "1" is written into the MTJ element M.

When the write controller 10 outputs the write drive signal /WR0 in the high level, the write drive signal WR0 in the low level, the write drive signal WR1 in the low level, and the write drive signal /WR1 in the high level, the P-channel MOSFET 211 and the N-channel MOSFET 221, and the N-channel MOSFET 212 and the P-channel MOSFET 222 become the OFF states. In this case, no write current I flow into the MTJ element M.

The write completion detector 30 selects either the node SN0 or SN1 in accordance with the write data D, and detects the completion of data write based on the selected node voltage. Next, the write completion detector 30 outputs the write completion signal DONE to the write controller 10.

The write completion detector 30 includes inverters 31, 32, 33, and 34, a multiplexer 35, and an XNOR gate 36.

The inverters 31, 32, and the inverters 33, 34 are respectively serving as buffers.

With reference to FIGS. 5A to 5F, an explanation will be given of a change in voltages at the node SN0, SN1 when the data has been written into the MTJ element. In this case, the MTJ element M has stored "1" beforehand.

Figure 5:
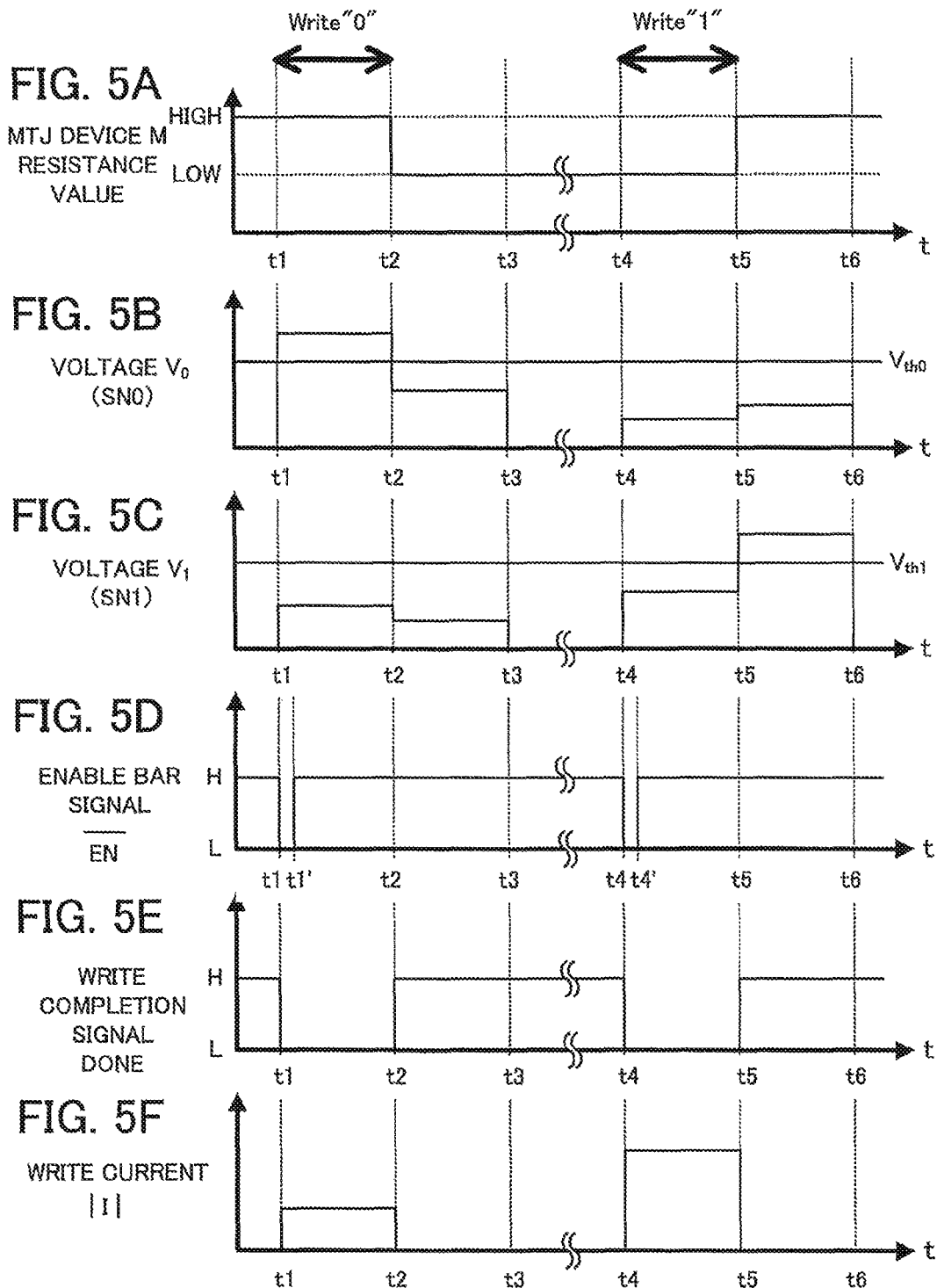
FIG. 5A is a timing chart illustrating a change with time in the resistance value of the MTJ element.
FIG. 5B is a timing chart illustrating a change with time in the voltage of a bit line.
FIG. 5C is a timing chart illustrating a change with time in the voltage of a bit line bar.
FIG. 5D is a timing chart illustrating a change with time in the signal level of an enable bar signal.
FIG. 5E is a timing chart illustrating a change with time in the signal level of a write completion signal.
FIG. 5F is a timing chart illustrating a change with time in a write current.

First, as illustrated in FIG. 5F, the write current I to write "0" into the MTJ element M has been flown from the time t1 to a time t2. The flowing write current I that is equal to or greater the current threshold into the MTJ element M causes the MTJ element M to change the resistance state, and as illustrated in FIG. 5A, the resistance value of the MTJ element M becomes low at the time t2. That is, the writing of "0" into the MTJ element M has completed.

As illustrated in FIGS. 5B and 5C, the voltage $V_0$ at the node SN0 and the voltage $V_1$ at the node SN1 decrease when the mu element M changes from the high-resistance state to the low-resistance state at the time t2. As for the change amount of voltage, the voltage $V_0$ at the node SN0 is larger than the voltage $V_1$ at the node SN1.

Next, as illustrated in FIG. 5F, the write current I to write "1" into the MTJ element M has been flown from the time t4 to a time t5. As illustrated in FIG. 5A, the resistance value of the MTJ element M becomes high at the time t5. That is, the writing of a "1" into the mu element M has completed.

As illustrated in FIGS. 5B and 5C, the voltage $V_1$ at the node SN1, and the voltage $V_0$ at the node SN0 increase when the MTJ element M changes from the low-resistance state to the high-resistance state at the time t5. Note that as for the change amount of voltage, the voltage $V_1$ at the node SN1 is larger than the voltage $V_0$ at the node SN0.

The minimum value of the voltage $V_0$ when the MTJ element M changes from the high-resistance state to the low-resistance state is larger than the maximum value of the voltage $V_0$ when the mu element M changes from the low-resistance state to the high-resistance state. In addition, the minimum value of the voltage $V_1$ when the MTJ element M charms from the low-resistance state to the high-resistance state is larger than the maximum value of the voltage $V_1$ when the MTJ element. M changes from the high-resistance state to the low-resistance state.

Based on those events, the threshold $V_{th0}$ is set for the inverter 31 to detect the completion of the writing of the writing data that is "0". The threshold $V_{th1}$ is set for the inverter 33 to detect the completion of the writing of the writing data that is "1".

Figure 6:
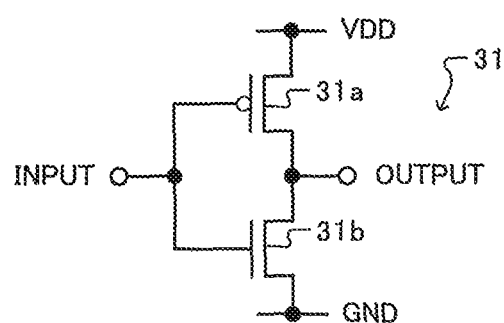
FIG. 6 is a diagram illustrating a structure of a CMOS-type inverter.

For example, as illustrated in FIG. 6, when the inverter 31 includes a Complementary MOS (CMOS), by adjusting the sizes (gate width and gate length) of a P-channel MOSFET 31a and those of an N-channel MOSFET 31b, or the concentration of dopants doped to the P-channel MOSFET 31a and the N-channel MOSFET 31b, the threshold $V_{th0}$ expressed by the following formula is set for the inverter 31.

$V_{0p} < V_{th0} < V_{0ap}$ where:

$V_{0ap}$ is the voltage at the node SN0 when the element M is in the high-resistance state; and $V_{0p}$ is the voltage at the node SN0 when the MTJ element M is in the low-resistance state.

The threshold $V_{th1}$ expressed by the following formula is set for the inverter 33.

$V_{1p} < V_{th1} < V_{1ap}$ where:

$V_{1ap}$ is the voltage at the node SN1 when the MTJ element M is in the high-resistance state; and $V_{1p}$ is the voltage at the node SN1 when the MTJ element M is in the low-resistance state.

More specifically, the thresholds $V_{th0}$, $V_{th1}$ are set to the values expressed by the following formulae.

$V_{th0} = (V_{0ap} + V_{0p})/2$ $V_{th1} = (V_{1ap} + V_{1p})/2$

Figure 4:
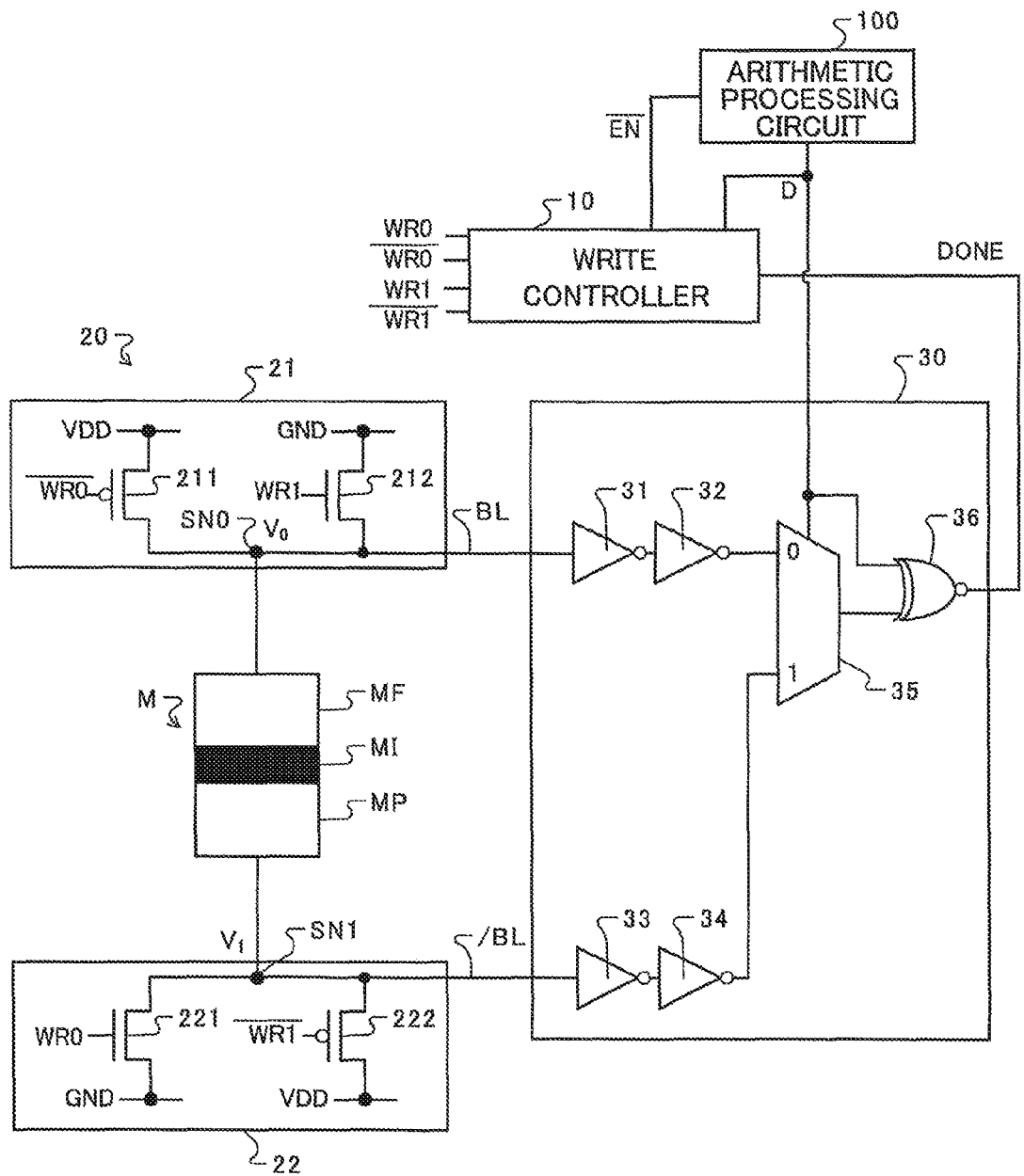
FIG. 4 is a diagram illustrating a circuit structure of a write driver and that of a write completion detector illustrated in FIG. 1.

With reference to FIG. 4, when the voltage $V_0$ (voltage at node SN0) of the hit line BL is larger than the threshold $V_{th0}$, a signal in the high level is supplied to the multiplexer 35 via the inverters 31, 32. Conversely, when the voltage $V_0$ of the bit line BL is smaller than the threshold $V_{th0}$, a signal in the low level is supplied to the multiplexer 35.

In addition, when the voltage $V_1$ (voltage at node SN1) of the bit line BL is smaller than the threshold $V_{th1}$, the signal in the low level is supplied to the multiplexer 35 via the inverters 33, 34. Conversely, when the voltage $V_1$ of the bit line BL is larger than the threshold $V_{th1}$, the signal in the high-level is supplied to the multiplexer 35.

Input to the multiplexer 35 are the output signals by the inverter 32 and the inverter 34, and the signal indicating the write data D supplied from the arithmetic processing circuit 100. The multiplexer 35 selects the signal corresponding to the write data D from the output signals by the inverter 32 and the inverter 34, and supplies the selected signal to the XNOR gate 36. When, for example, the write data D is "0", the multiplexer 35 supplies the output signal by the inverter 32 to the XNOR gate 36.

When the write data D is "1", the multiplexer 35 supplies the output signal by the inverter 34 to the XNOR gate 36.

The XNOR gate 36 outputs the write completion signal DONE that is an XNOR (exclusive NOR) which has the input signal indicating the write data D supplied from the arithmetic processing circuit 100 and also the output signal by the multiplexer 35.

When the write data D is "0" (signal level is low level) and the voltage $V_0$ at the node SN0 exceeds the threshold $V_{th0}$, the multiplexer 35 outputs the signal in the high level. In this case, the XNOR gate 36 outputs the write completion signal DONE in the low level.

When the write data D is "0" (signal level is low level) and the voltage $V_0$ at the node SN0 is lower than the threshold $V_{th0}$, the multiplexer 35 outputs the signal in the low level. In this case, the XNOR gate 36 outputs the write completion signal DONE in the high level.

In addition, when the write data is "1" (signal level is high level) and the voltage $V_1$ at the node SN1 is lower than the threshold $V_{th1}$, the multiplexer 35 outputs the signal in the low level. In this case, the XNOR gate 36 outputs the write completion signal DONE in the low level.

When the write data D is "1" (signal level is high level) and the voltage $V_1$ at the node SN1 exceeds the threshold $V_{th1}$, the multiplexer 35 outputs the signal in the high level. In this case, the XNOR gate 36 outputs the write completion signal DONE in the high level.

The write completion signal DONE output by the write completion detector 30 in this way is supplied to the write controller 10.

The data-write device 1 employing the above structure writes the data that is "0" or "1" into the MTJ element M based on the write data D and the enable bar signal /EN both received from the arithmetic processing circuit 100.

An explanation will be given of a writing action of the data-write device 1 with reference to FIGS. 7 to 9. In this case, an explanation will be given of an example case in which the write data D that is "0" is to be written into the MTJ element M storing the data "1", that is, being in the high-resistance state.

Figure 7:
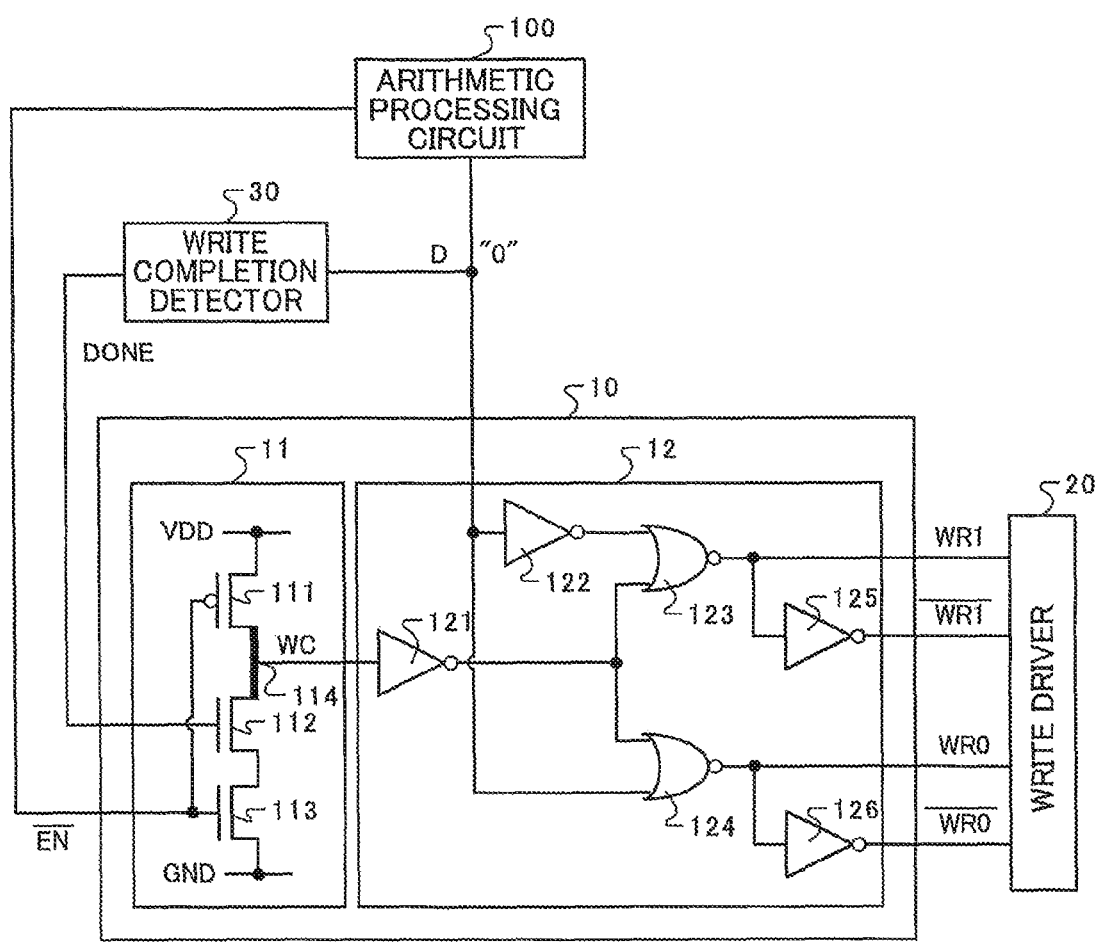
FIG. 7 is a diagram illustrating an action of the write controller when write data "0" is to be written.

With reference to FIG. 7, the arithmetic processing circuit 100 outputs the enable bar signal in the low level for a predetermined time period (request for data write). The enable bar signal /EN in the low level causes the P-channel MOSFET 111 of the control signal supplier 11 to become the ON state, while the N-channel MOSFET 113 to become the OFF state. The write completion detector 30 outputs the write completion signal DONE in the high level after detecting the completion of the last data write. Hence, the N-channel MOSFET 112 maintains the ON state. That is, the supplied enable bar signal /EN in the low level from the arithmetic processing circuit 100 changes the state to the initialization state (P-channel MOSFET 111 and N-channel MOSFET 112 are in ON state, and N-channel MOSFET 113 is in OFF state). In the initialization state, the voltage of the power supply line VDD accumulates charges in the region (node 144) between the P-channel MOSFET 111 and the N-channel MOSFET 113. Hence, the accumulated charges at the node 114 supply the write control signal WC in the high level to the drive signal supplier 12.

Still further, the signal (low level) indicating the write data "0" supplied from the arithmetic processing circuit 100 is input to the drive signal supplier 12. When the write control signal WC in the high level and, the signal indicating the write data "0" are supplied, the drive signal supplier 12 supplies, to the write driver 20, the write drive signal WR0 in the high level and the write drive signal /WR0 in the low level (write drive signal WR in the active level). Note that the write drive signal WR1 is in the low level, and the write drive signal /WR1 is in the high level.

Figure 8:
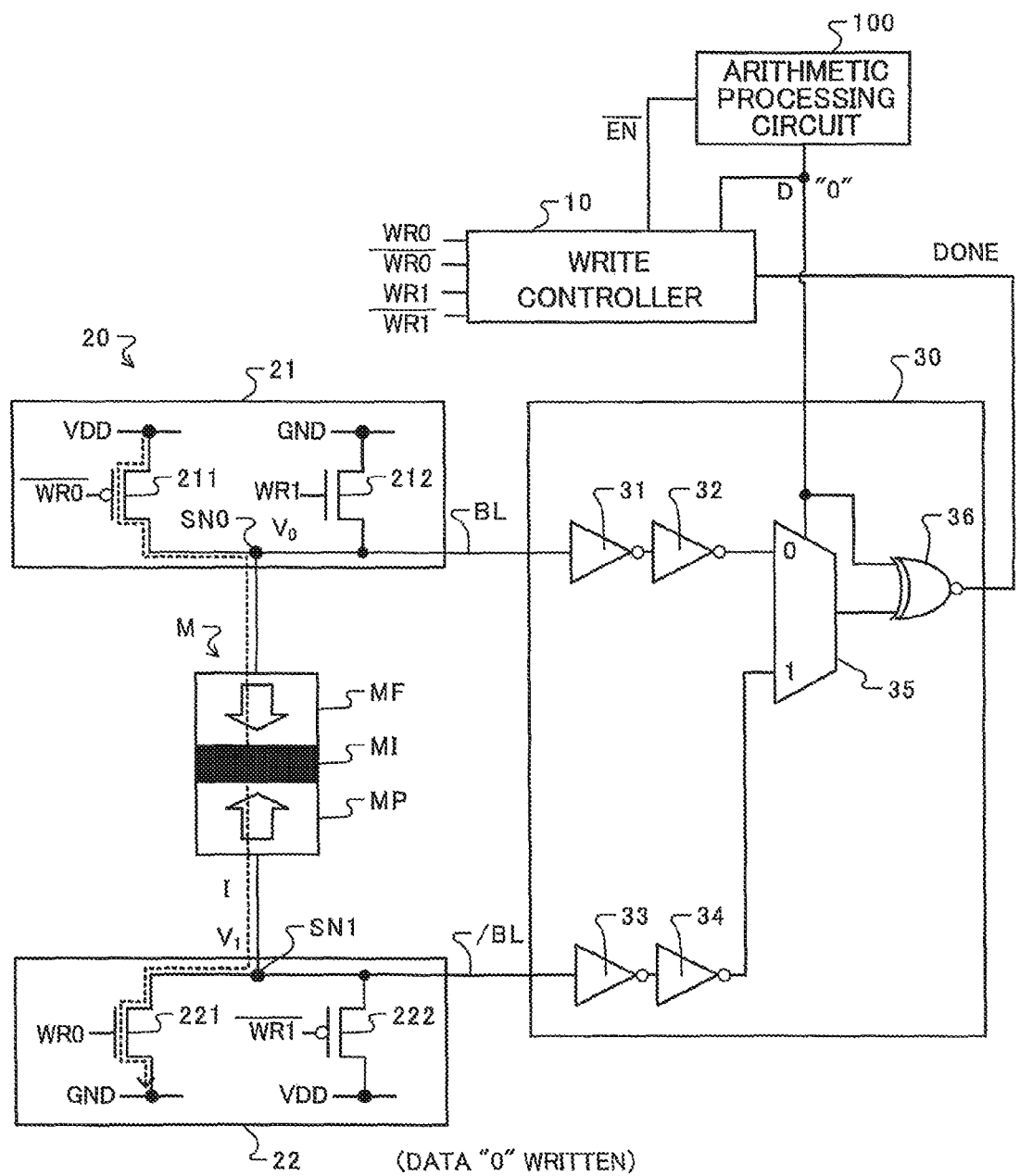
FIG. 8 is a diagram illustrating an action of the write driver and that of the write completion detector when the write data "0" is to be written.

Hence, as illustrated in FIG. 8, the P-channel MOSFET 211 of the bit line driver 21 and the N-channel MOSFET 221 of the bit line bar driver 22 become the ON states. That is, the write current I (forward direction current) flows through the current path which is indicated by the dashed line, and which is formed by the power supply line VDD, the P-channel MOSFET 211, the bit line BL, the MTJ element M, the hit line bar /BL, and the N-channel MOSFET 221.

In this case, the voltage $V_0$ at the node SN0 at this time is larger than the threshold $V_{th0}$ of the inverter 31. In this case, input to the XNOR gate 36 are the signal (low level) indicating the write data D that is "0" supplied from the arithmetic processing circuit 100, and the signal in the high level supplied from the multiplexer 35, and the XNOR gate 36 outputs the write completion signal DONE in the low level. That is, when the writing of the write data "0" into the MTJ element M in the high-resistance state (having stored data "1") starts, the write completion detector 30 starts supplying the write completion signal DONE in the low level to the write controller 10. As illustrated in FIGS. 5D and 5E, immediately after the enable bar signal /EN becomes the low level and the writing of the write data starts, the write completion signal DONE becomes the low level.

With reference to FIG. 7, the supplied write completion signal DONE in the low level causes the N-channel MOSFET 112 of the control signal supplier 11 to be in an OFF state. Conversely, the P-channel MOSFET 111 maintains the ON state, while the N-channel MOSFET 113 maintains the OFF state. In this case, also, the accumulated charges at the node 114 keep supplying the write control signal WC in the high level to the drive signal supplier 12. Next, the drive signal supplier 12 supplies, to the write driver 20, the write drive signal WR0 in the high level and the write drive signal /WR0 to the low level, and the write drive signal WR1 in the low level and the write drive signal /WR1 in the high level. That is, when receiving the write completion signal DONE in the low level from the write completion detector 30, also, the write controller 10 still keeps supplying the write drive signal WR in the active level to the write driver 20.

When, after starting the supply of the enable bar signal /EN in the low level, a predetermined time period has elapsed, the arithmetic processing circuit 100 terminates the supply of the enable bar signal /EN in the low level. Next, the arithmetic processing circuit 100 starts supplying the enable bar signal in the high level. The supplied enable bar signal /EN in the high, level causes the P-channel MOSFET 111 to become the OFF state, and the N-channel MOSFET 113 to become the ON state. Conversely, the N-channel MOSFET 112 maintains the OFF state. At this time, also, the accumulated charges at the node 114 keep supplying the write control signal WC in the high level to the drive signal supplier 12. Next, the drive signal supplier 12 supplies, to the write driver 20, the write drive signal WIN0 in the high level and the write drive signal /WR0 in the low level, and the write drive signal WR1 in the low level and the write drive signal WR1 in the high level. That is, when receiving the enable bar signal /EN in the high level from the arithmetic processing circuit 100, also, the write controller 10 still keeps supplying the write drive signal WR in the active level to the write driver 20.

Next, when the write current I that is equal to or greater than the current threshold flows in the direction to the pin layer MP from the free layer MF of the MTJ element in the high-resistance state illustrated in FIG. 8, as illustrated in portion B of FIG. 2B, the MTJ element M switches to the low-resistance state. At this time, as illustrated in FIGS. 5A and 5B, the voltage $V_0$ of the node SN0 becomes smaller than the threshold $V_{th0}$ of the inverter 31. In this case, input to the XNOR gate 36 are the signal (low level) indicating the write data D that is "0" supplied from the arithmetic processing circuit 100 and the signal in the low level supplied from the multiplexer 35. Hence, the XNOR gate 36 outputs the Write completion signal DONE, in the high level. That is, the state change of the MTJ element M from the high-resistance state to the low-resistance state causes the write completion detector 30 to start supplying the write completion signal DONE in the high level to the write controller 10.

Figure 9:
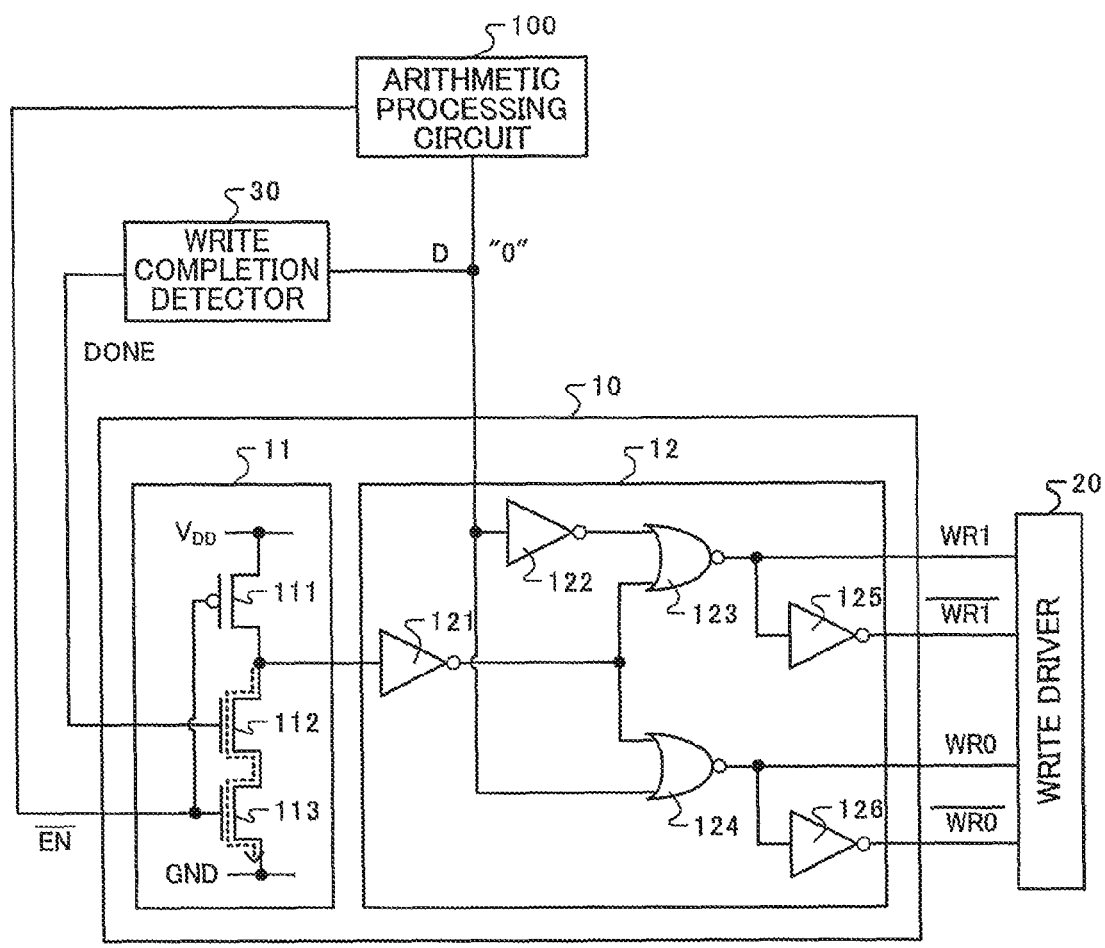
FIG. 9 is a diagram illustrating an action of the write controller when the write data "0" has been written.

With reference to FIG. 9, the supplied write completion signal DONE in the high level causes the N-channel MOSFET 112 to become the ON state. At this time, the P-channel MOSFET 111 becomes the OFF state, and the N-channel MOSFET 112 and the N-channel MOSFET 113 become the ON states. Hence, the accumulated charges at the region (node 114) between the P-channel MOSFET 111 and the N-channel MOSFET 112 are discharged to the ground line GND.

Hence, the write control signal WC supplied from the control signal supplier 11 to the drive signal supplier 12 becomes the low level. Accordingly, the write drive signal WR0 becomes the low level, and the write drive signal /WR0 becomes the high level. That is, as illustrated in FIGS. 5E and 5F, the write controller 10 terminates the supply of the write current I to the write driver 20 upon receiving the write completion signal DONE in the high level. Through the above actions, the writing of the write data D that is "0" into the MTJ element M completes.

Next, with reference to FIGS. 10 to 12, an explanation will be given of an action of the data-write device 1 when the write data D that is "1" is written into the MTJ element M that has stored the data "0", that is, the MTJ element M in the low-resistance state. As for the direction of the write current I, the directions are opposite when the write data D that is "1" is written and when the write data D that is "0" is written. However, the basic writing action is the same as the action as explained above.

Figure 10:
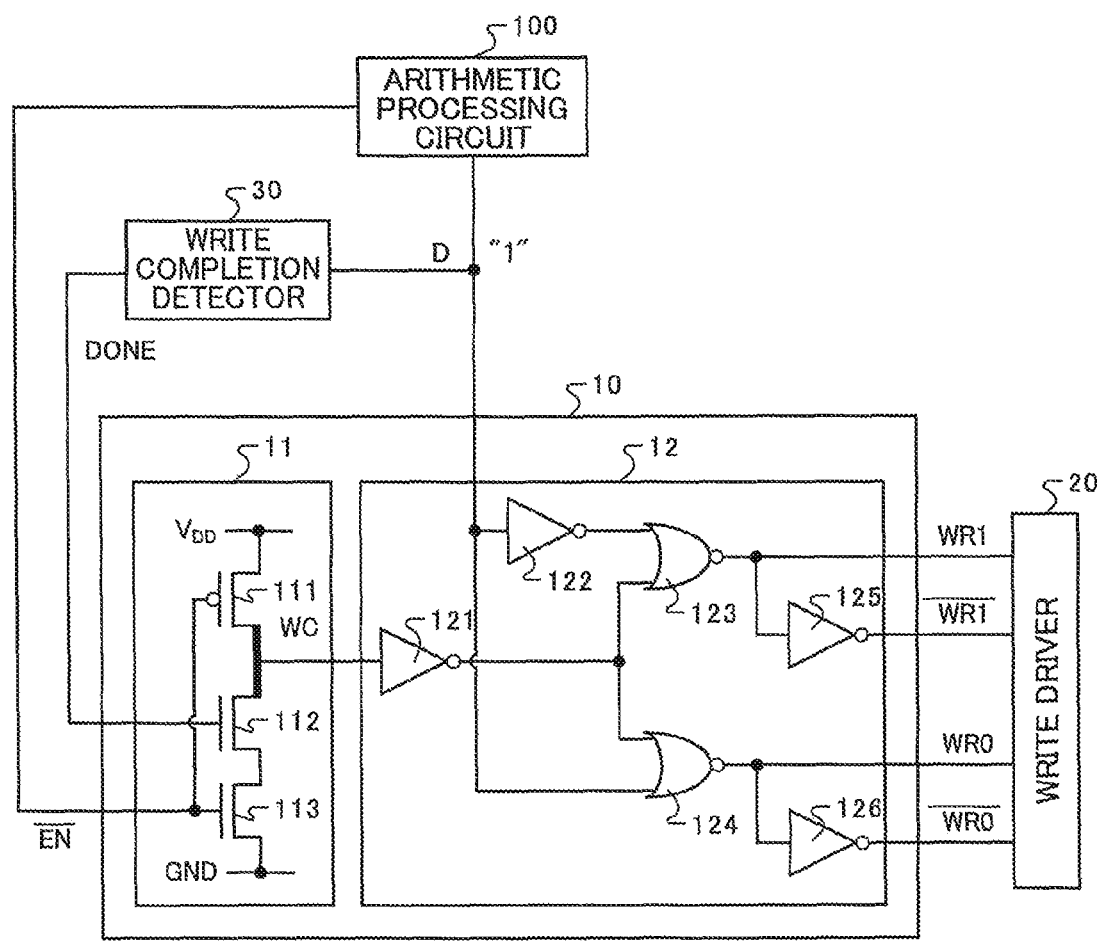
FIG. 10 is a diagram illustrating an action of the write controller when write data "1" is to be written.

With reference to FIG. 10, like the case in which the write data D that is "0" is written, the arithmetic processing circuit 100 outputs the enable bar signal /EN in the low level for the predetermined time period (request for data write). Hence, the P-channel MOSFET 111 becomes the ON state, the N-channel MOSFET 112 becomes the ON state, and the N-channel MOSFET 113 becomes the OFF state (initialization state). In addition, the accumulated charges at the node 114 supply the write control signal WC in the high level to the drive signal supplier 11

Still further, input to the drive signal supplier 12 is the signal (high level) indicating the write data D that is "1" supplied from the arithmetic processing circuit 100, The drive signal supplier 12 supplies, to the write driver 20, the write drive signal WR1 in the high level and the write drive signal /WR1 in the low level (write drive signal WR in active level) upon the supply of the write control signal WC in the high level and the signal indicating the write data D that is "1". Note that the drive signal WR0 is in the low level, while the write drive signal /WR0 is in the high level.

Figure 11:
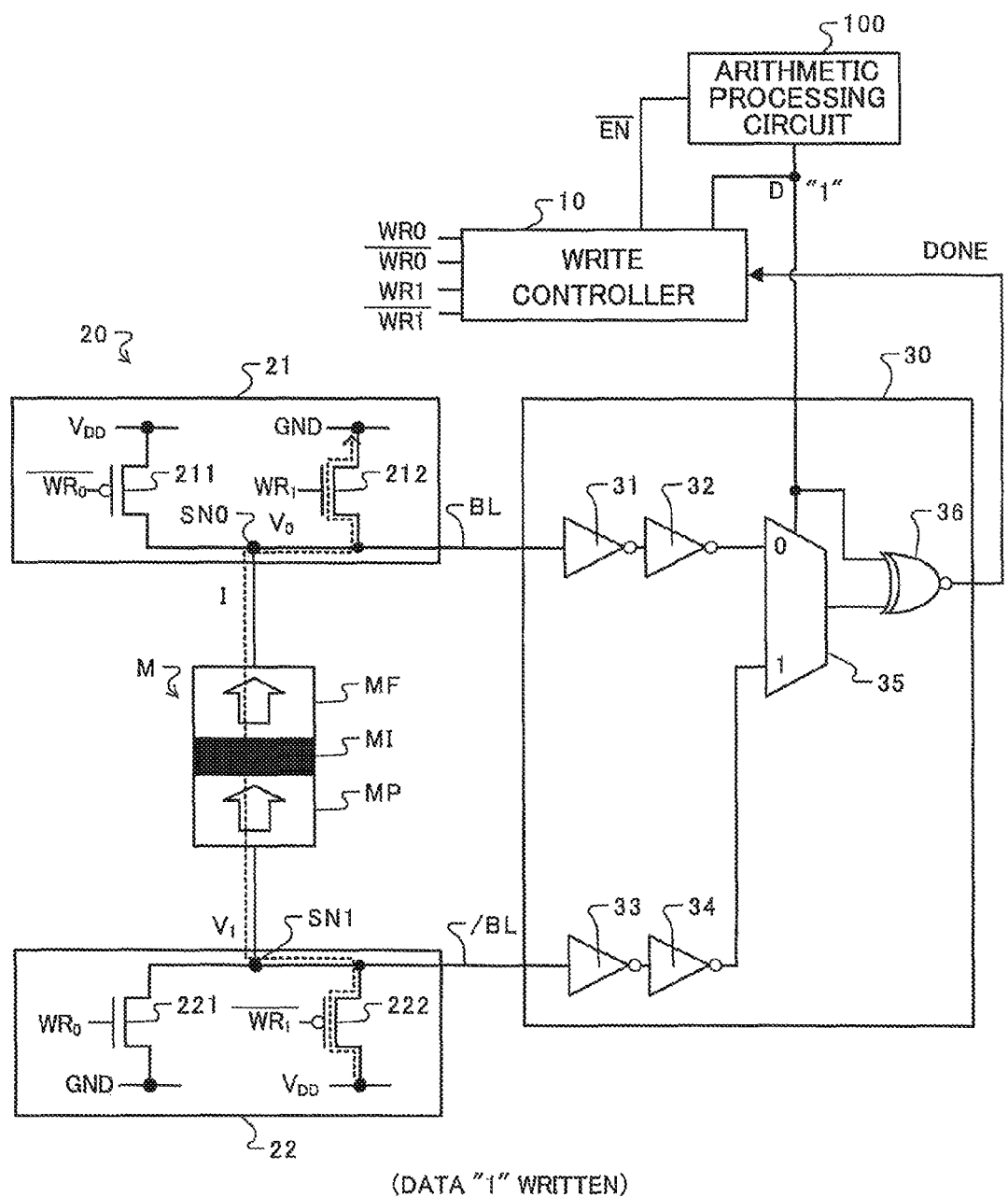
FIG. 11 is a diagram illustrating an action of the write driver and that of the writing completing detector when the write data "1" is to be written.

Hence, as indicated in the dashed line in FIG. 11, the write current I (reverse direction current) flows through the P-channel MOSFET 222, the bit line bar /BL, the MTJ element M, the bit line BL, and the N-channel MOSFET 212 in this sequence from the power supply line VDD.

In addition, the voltage $V_1$ at the node SN1 at this time is smaller than the threshold $V_{th1}$ of the inverter 33. In this case, the XNOR gate 36 starts outputting the write completion signal DONE in the low level. That is, when the writing of the write data "1" into the MTJ element M in the low-resistance state (having stored data "0") starts, the write completion detector 30 starts outputting the write completion signal DONE in the low level to the write controller 10.

With reference to FIG. 10, when the write completion signal DONE in the low level is input from the write completion detector 30, the N-channel MOSFET 112 of the control signal supplier 11 becomes the OFF state. Conversely, the P-channel MOSFET 111 maintains the ON state, while the M-channel MOSFET 113 maintains the OFF state. In this case, also, the write controller 10 still keeps supplying the write drive signal WR in the active level to the write driver 20.

After starting the supply of the enable bar signal /EN in the low level, and when a predetermined time period has elapsed, the arithmetic processing circuit 100 terminates the supply of the enable bar signal /EN in the low level. Next, the arithmetic processing circuit 100 starts supplying the enable bar signal /EN in the high level. The supplied enable bar signal /EN in the high level causes the P-channel MOSFET 111 to become the OFF state, and the N-channel MOSFET 113 to become the ON state. Conversely, the N-channel MOSFET 112 maintains the OFF state. At this time, also, the write controller 10 still keeps supplying the write drive signal WR in the active level to the write driver 20.

Next, when the write current I that is equal to or greater than the current threshold flows in the direction to the free layer MF from the pin layer MP of the MTJ element M in the low-resistance state illustrated in FIG. 11, the MTJ element M switches to the high-resistance state as illustrated in portion A of FIG. 2. In this case, as illustrated in FIGS. 5A and 5C, the voltage $V_1$ at the node SN1 becomes larger than the threshold $V_{th1}$ of the inverter 33. In this case, input to the XNOR gate 36 are the signal (high level) indicating the write data D that is "1" supplied from the arithmetic processing circuit 100, and the signal in the high level supplied from the multiplexer 35, and the XNOR gate 36 outputs the write completion signal DONE in the high level. That is, the state change of the MTJ element M from the low-resistance state to the high-resistance state causes the write completion detector 30 to start supplying the write completion signal DONE in the high level to the write controller 10.

Figure 12:
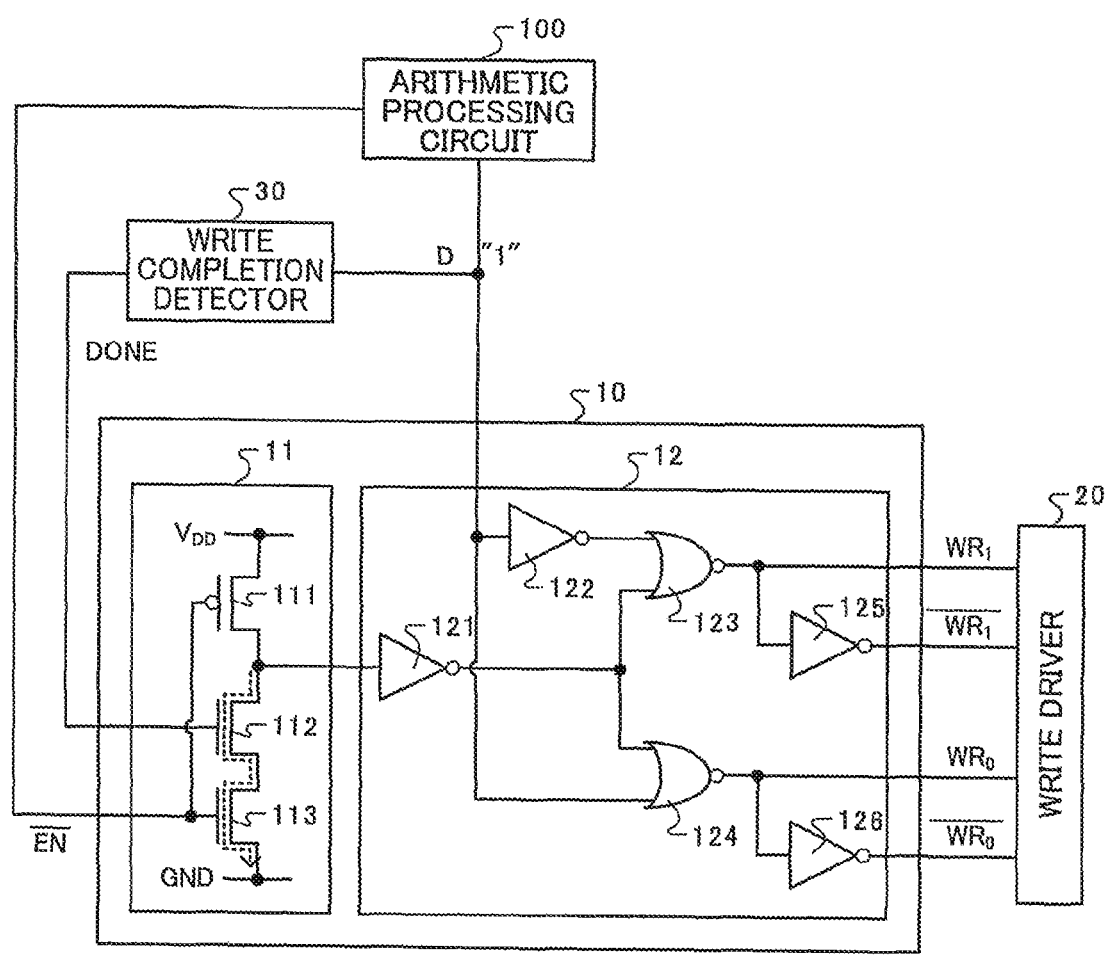
FIG. 12 is a diagram illustrating an action of the write controller when the write Data "1" has been written.

With reference to FIG. 12, when the write completion signal DONE in the high level is input to the gate of the N-channel MOSFET 112 of the write controller 10, the N-channel MOSFET 112 becomes the ON state. At this time, the P-channel MOSFET 111 becomes the OFF state, and the N-channel MOSFET 112 and the N-channel MOSFET 113 become the ON state, and the accumulated charges at the region (node 114) between the P-channel MOSFET 111 and the N-channel MOSFET 112 are discharged to the ground line GND.

As illustrated in FIGS. 5E and 5F, the write controller 10 causes, upon receiving the write completion signal DONE in the high level, the write driver 20 to terminate the supply of the write current I. Through the above actions, the writing of the write data D that is "1" into the MTJ element M completes.

As explained above, the data-write device 1 according to this embodiment continuously monitors the node voltage at either the node SN0 of the bit line BL or the node SN1 of the bit line bar /BL in accordance with the write data D. When the node voltage to be monitored satisfies the threshold condition, the data-write device 1 detects the completion of the writing of the data D into the MTJ element M. According to such a structure, a high detection margin for the write completion is ensured, while at the same time, the power consumption at the time of data write is reduced by a simple structure.

In the above embodiment, the explanation has been given of an example case in which the data different from the data already stored into the MTJ element M is written. When the same data as the data stored into the MTJ element M is to be written, the write controller 10 completes the data write upon receiving the enable bar signal /EN in the high level from the arithmetic processing circuit 100.

A specific explanation will be given of a case in which the data stored into the MTJ element M is "0". When the write current I is supplied to the MTJ element M by the write driver 20, the signal in the low level is supplied from the multiplexer 35 to the XNOR gate 36. Hence, the XNOR gate 36 outputs the write completion signal DONE in the high level. That is, when, in accordance with the request from the arithmetic processing circuit 100, the writing of the data that is the same as the data stored into the MTJ element M starts, the signal level of the write completion signal DONE supplied to the write controller 10 from the write completion detector 30 remains the same in high level. Subsequently, when the enable bar signal /EN in the high level from the arithmetic processing circuit 100 is supplied to the control signal supplier 11, the P-channel MOSFET 11 becomes the OFF state, and the N-channel MOSFET 112, the N-channel MOSFET 113 become the ON states. Hence, the write control signal WC to be supplied to the drive signal supplier 12 from the control signal supplier 11 becomes the low level, and the write driver 20 terminates the supply of the write current I to the MTJ element M. Hence, when the same data as the data stored into the MTJ element M is written, the supply of the write current I to the MTJ element M is immediately terminated. Accordingly, a wasteful power consumption is suppressed. In addition, since the node subjected to the detection of voltage change is automatically changed in accordance with the desired writing data, a high detection margin for the write completion is obtainable regardless of the application direction of the write current.

Note that the write completion detector 30 of the above embodiment includes the four inverters 31, 32, 33, and 34 disposed at two stages. Alternatively, the write completion detector 30 may include two buffers which detect that the voltages $V_0$, $V_1$ of the nodes SN0, SN1 satisfy the respective threshold conditions. In addition, the write completion detector 30 may include, multiple stage by multiple stage, equal to or greater than four inverters which detect that the voltages $V_0$, $V_1$ of the nodes SN0, SN1 satisfy the respective threshold conditions.

In addition, the circuit structure of the write completion detector 30 can be changed as appropriate as long as, when the voltage $V_0$ at the node SN0 becomes lower than the threshold $V_{th0}$ or when the voltage $V_1$ at the node SN1 exceeds the threshold $V_{th1}$ (when either the node SN0 or SN1 satisfies the threshold condition), the write completion detector 30 outputs the write completion signal DONE in the high level, and outputs the write completion signal DONE in the low level in other cases. In this case, the inverters 31-34, the multiplexer 35, and the XNOR gate 36 may be omitted or replaced with other structures as appropriate. In this case, also, the arithmetic processing circuit 100 may employ a structure so as not to supply the write data D to the write completion detector 30.

Figure 13:
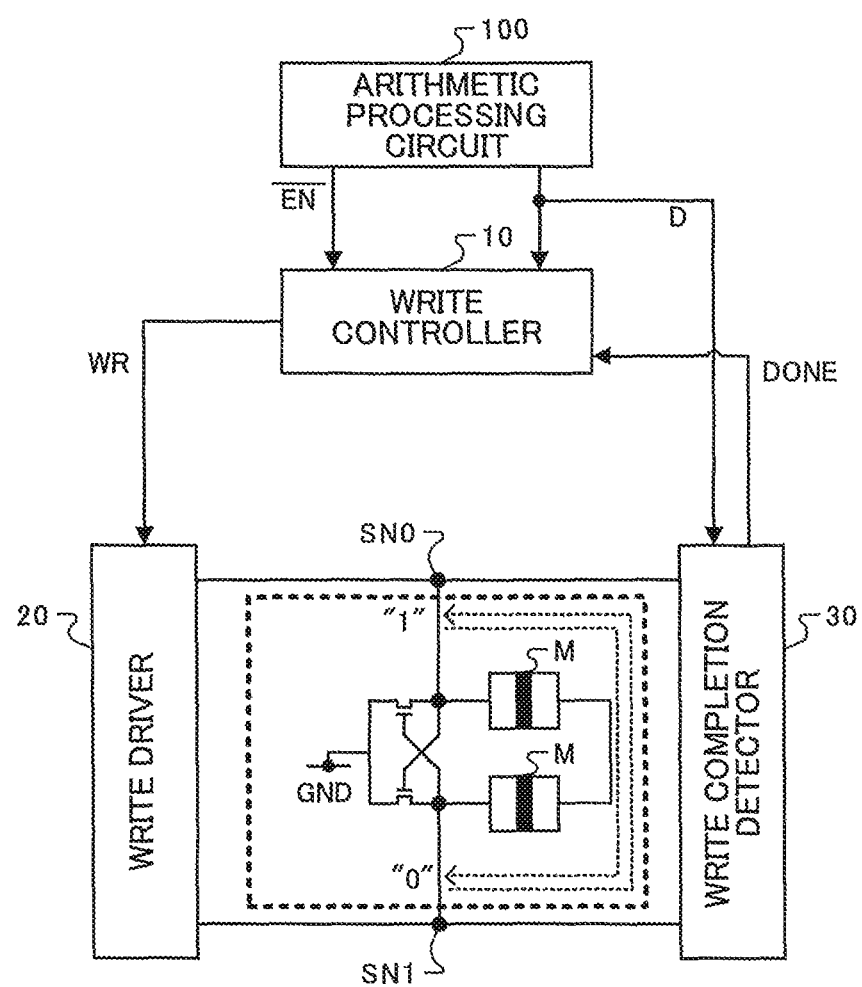
FIG. 13 is a block diagram illustrating a structure of a data-write device according to a first modified example of the present disclosure.

In addition, as illustrated in FIG. 13, the memory cell MC may include a pair of MTJ elements M. The pair of MTJ elements M are set so as to be complementary activated, and the one MTJ element M is in the high-resistance state, while the other MTJ element M is in the low-resistance state. The resistance state combination of the pair of MTJ elements M is associated with the data D that is "1" or "0". In this case, also, the data-write device 1 monitors the voltage at either the node SN0 or SN1 in accordance with the write data D. The data-write device 1 detects the completion of the data write in the memory cell MC (pair of MTJ elements M) when determining that the node voltage in accordance with the write data D satisfies the threshold condition.

Still further, when the memory circuit includes multiple memory cells, the data-write device 1 may include a word line driver 110 that selects each memory cell. This enables the data-write device to detect the completion of data write in each memory cell MC.

Figure 14:
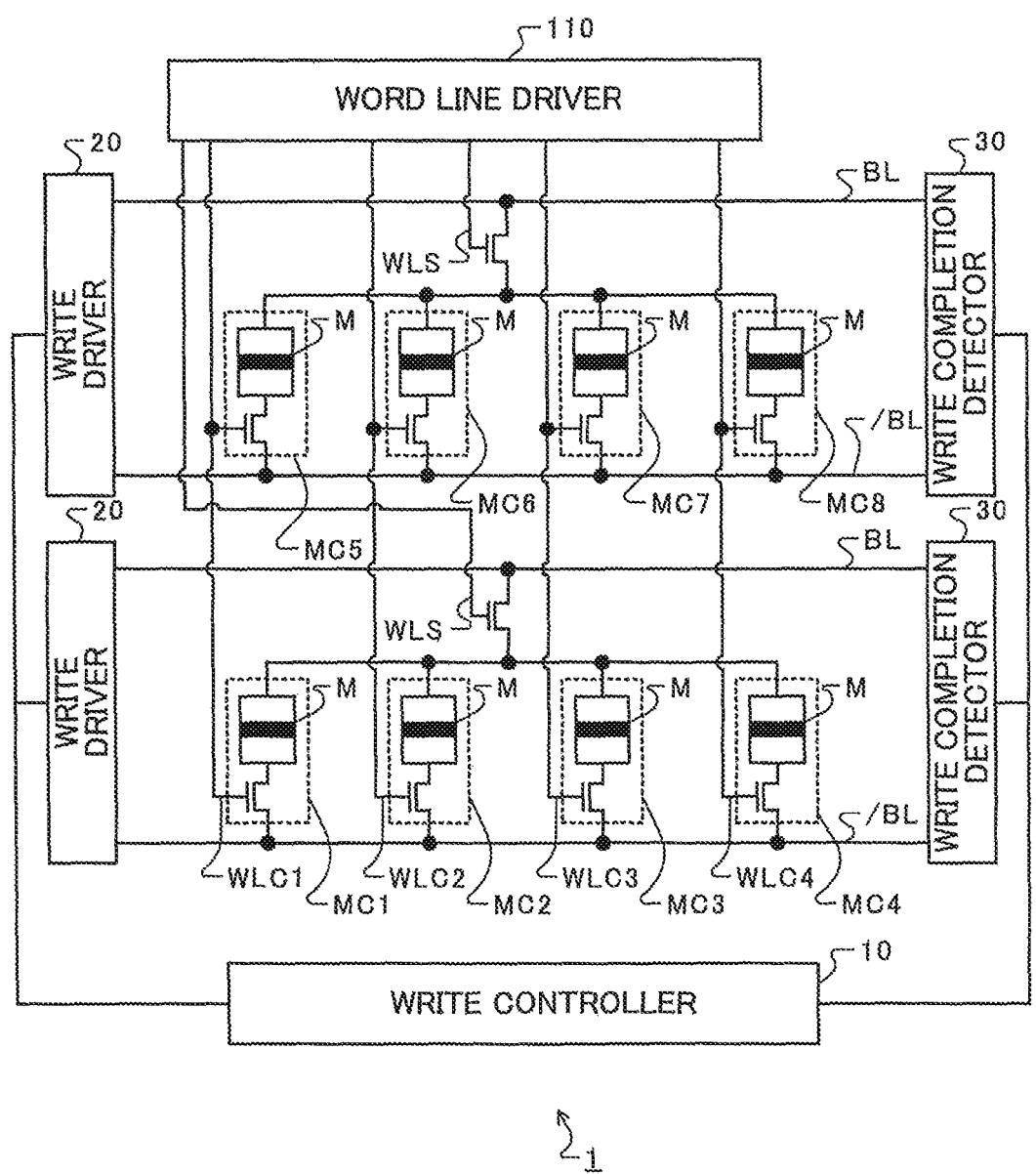
FIG. 14 is a block diagram illustrating a structure of a data-write device according to a second modified example of the present disclosure.

FIG. 14 illustrates a memory circuit that includes the multiple memory cells MC. The multiple memory cells MC are laid out in a matrix, and the write driver 20 and the write completion detector 30 are laid out for each row. Each memory cell MC is connected to a word line WLC for selecting the individual memory cell MC, and a word line WLS for selecting the multiple memory cells MC for each section. The word line driver 110 receives information (for example, a coordinate value) indicating the location of the memory cell MC subjected to the writing from the arithmetic processing circuit 100. The word line driver 110 decodes the received information (for example, a coordinate value) indicating the location, and specifies the location (row and column) of the memory cell MC. The word line driver 110 outputs, based on the specified location of the memory cell MC, the signal in the active level to the word lines WLS, WLC connected to the memory cell MC. The word line driver 110 causes the word lines WLS, WLC connected to the writing destination memory cell MC to be active, thereby making the memory cell MC in the writable state. When, for example, specifying the location of a memory cell MC1, the word line driver 110 outputs the signal in the active level to the word line WLS and a word line WLC1 connected to the memory cell MC1, thereby making the memory cell MC1 in the writable state. The write controller 10 supplies the write drive signal in the active level to the write driver 20 corresponding to the row of the specified memory cell MC.

In this state, like the above embodiment, based on the write drive signal in the active level received from the write controller 10, the write driver 20 supplies the write current in the direction corresponding to the write data to the bit line BL and the bit line bar /BL Hence, the write current flows into the MTJ element M of the memory cell MC1, and thus the write data is written into the MTJ element M.

Next, the write completion detector 30 laid out at the same row as that of the write driver 20 detects the completion of data write when the voltage of the connection node (node SN0) corresponding to the write data (for example, data "0") exceeds the threshold ($V_{th0}$), and supplies the write completion signal DONE in the high level to the write controller 10. When the write completion signal DONE in the high level is supplied from the write completion detector 30, the write controller 10 causes the write driver 20 to terminate the supply of the write current. This completes the data write into the MTJ element M in the memory cell MC1.

In addition, the memory element in which the write data is written is not limited to the MTJ element, and may be, for example, a resistance-change memory element like a Resistance Random Access Memory (ReRAM).

The present disclosure is not limited to the above descriptions of embodiments and drawings, and a modifications and the like can be made as appropriate to the above embodiments and drawings.

This application is based on Japanese Patent Application No. 2014-60901 filed on Mar. 24, 2014. The entire specification, claims, and drawings of Japanese Patent Application No. 2014-60901 are herein incorporated in this specification by reference.

INDUSTRIAL APPLICABILITY

According to the present disclosure, as for data write in a resistance-change memory element, a high detection margin for write completion is ensured, while at the same time, a power consumption at the time of data write is reduced by a simple structure.

REFERENCE SIGNS LIST

1 Data-write device
10 Write controller
11 Control signal supplier
12 Drive signal supplier
111 P-channel MOSFET
112, 113 N-channel MOSFET
114 Node
121, 122, 125, 126 Inverter
123, 124 NOR gate
20 Write driver
21 Bit line driver
22 Bit line bar driver
211, 222 P-channel MOSFET
212, 221 N-channel MOSFET
30 Write completion detector
31, 32, 33, 34 inverter
35 Multiplexer
36 XNOR gate
MC Memory cell
M MTJ element
MF Free layer
MI Insulation layer
MP Pin layer
BL Bit line
/BL Bit line bar
SN0, SN1 Node
DONE Write completion signal
WR, WR0, /WR0, WR1, /WR1 Write drive signal
Write data
/EN Enable bar signal
WC Write control signal
I Write current

The invention claimed is:

1. A data-write device for a resistance-change memory element, wherein
memory cells are disposed in an N×M arrangement (N>1, M>1), one of the memory cells including a resistance-change memory element having two terminals and an NMOS transistor for selecting the memory element,
in each row from a first to an Nth row, an end of the memory element included in the M memory cells is connected to a first connection node in which a drain node of a first PMOS transistor and a drain node of a first NMOS transistor are connected via a NMOS transistor for selection for selecting the memory cells disposed in the N×M arrangement for each row,
in each row, from the first to the Nth row, another end, that is not connected to the memory element of the current path of the NMOS transistor included in the M memory cells, is connected to a second connection node in which a drain node of a second PMOS transistor and a drain node of a second NMOS transistor are connected, and
the NMOS transistors included in each of the memory cells are transistors for selecting the memory elements for each column,
the data-write device comprising:
write means that causes a current to flow through in the order of the first PMOS transistor, the NMOS transistor for selection, the memory element, the NMOS transistor included in the memory cell, and the second NMOS transistor, or in the order of the second PMOS transistor, the NMOS transistor included in the memory cell, the memory element, the NMOS transistor for selection, and the first NMOS transistor in accordance with data to be written, thereby writing the data in the memory element;
write completion detecting means that monitors a voltage at the first connection node or the second connection node in accordance with the data to be written after data writing in the memory element starts, detects a completion of the writing of the data based on the voltage at the either connection node, and supplies a write completion signal indicating the completion of writing of the data; and
write control means that causes the write means to terminate the writing of the data in the memory element in response to the write completion signal supplied from the write completion detecting means.

2. The resistance-change-memory-element data-write device according to claim 1, wherein when the voltage at the either one end of the memory element exceeds a pre-set threshold or becomes lower than the threshold, the write completion detecting means supplies the write completion signal.

3. The resistance-change-memory-element data-write device according to claim 1, wherein:

the write completion detecting means comprises an inverter; and when the voltage at the either one end of the memory element exceeds a threshold set for the inverter or becomes lower than the threshold, the inverter outputs the write completion signal.

4. The resistance-change-memory-element data-write device according to claim 1, wherein the write completion detecting means outputs the write completion signal when:

the write means writes first data in the memory element, the memory element changes from a low-resistance state to a high-resistance state, and a voltage at a first end of the memory element becomes a larger value than a first threshold from a smaller value than the first threshold; and the write means writes second data in the memory element, the memory element changes from the high-resistance state to the low-resistance state, and a voltage at a second end of the memory element becomes a smaller value than a second threshold from a larger value than the second threshold.

5. The resistance-change-memory-element data-write device according to claim 1, wherein the write completion detecting means comprises means that selects either a voltage at a first end of the write means or a voltage at a second end thereof in accordance with the data to be written.

6. The resistance-change-memory-element data-write device according to claim 1, wherein:

the write control means comprises;

a write request acceptor that accepts a request for writing first data or second data;

a first write controller that causes the write means to write the first data in the memory element in accordance with the request for writing the first data accepted by the write request acceptor; and a second write controller that causes the write means to write the second data in the memory element in accordance with the request for writing the second data accepted by the write request acceptor, the first write controller causes the write means to terminate the writing of the first data in the memory element in response to the write completion signal corresponding to the first data and supplied from the write completion detecting means; and the second write controller causes the write means to terminate the writing of the second data in the memory element in response to the write completion signal corresponding to the second data and supplied from the write completion detecting means.

7. The resistance-change-memory-element data-write device according to claim 1, wherein:

a plurality of the memory elements is laid out;

an end of each of the memory elements is connected to a pair of bit lines via a transistor for selection;

the write means writes the data to be written in the selected rmemory element via the pair of bit lines; and the write completion detecting means detects the completion of the data writing based on a voltage at the either bit line to which the one end of the selected memory element is connected.

* * * * *